US009293627B1

(12) United States Patent
Beechem, III et al.

(10) Patent No.: US 9,293,627 B1
(45) Date of Patent: Mar. 22, 2016

(54) SUB-WAVELENGTH ANTENNA ENHANCED BILAYER GRAPHENE TUNABLE PHOTODETECTOR

(71) Applicant: Sandia Corporation, Albuquerque, NM (US)

(72) Inventors: Thomas Edwin Beechem, III, Albuquerque, NM (US); Stephen W. Howell, Albuquerque, NM (US); David W. Peters, Albuquerque, NM (US); Paul Davids, Albuquerque, NM (US); Taisuke Ohta, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 14 days.

(21) Appl. No.: 14/056,023

(22) Filed: Oct. 17, 2013

Related U.S. Application Data

(60) Provisional application No. 61/732,667, filed on Dec. 3, 2012.

(51) Int. Cl.
| | | |
|---|---|---|
| *H01L 31/113* | (2006.01) | |
| *H01L 29/66* | (2006.01) | |
| *H01L 29/16* | (2006.01) | |
| *H01L 51/42* | (2006.01) | |
| *H01L 31/0232* | (2014.01) | |

(52) U.S. Cl.
CPC ........ *H01L 31/1136* (2013.01); *H01L 29/1606* (2013.01); *H01L 29/66037* (2013.01); *H01L 29/66045* (2013.01); *H01L 31/0232* (2013.01); *H01L 51/428* (2013.01); *H01L 29/66015* (2013.01)

(58) Field of Classification Search
CPC ................. H01L 29/1606; H01L 29/66015; H01L 29/66022; H01L 29/6603; H01L 29/66037; H01L 29/66045; H01L 51/428
See application file for complete search history.

(56) References Cited

U.S. PATENT DOCUMENTS

| | | | | |
|---|---|---|---|---|
| 8,053,782 B2* | 11/2011 | Avouris | ............. | H01L 29/1606 257/76 |
| 8,105,928 B2* | 1/2012 | Lin | ..................... | H01L 29/1606 257/29 |
| 8,395,142 B2* | 3/2013 | Komiyama | ....... | H01L 27/14649 250/338.1 |
| 8,450,198 B2* | 5/2013 | Lin | ..................... | H01L 29/1606 257/29 |
| 8,452,134 B1* | 5/2013 | Davids | ...................... | G01J 1/42 385/12 |
| 8,455,861 B2* | 6/2013 | Lin | ..................... | H01L 29/1606 257/29 |
| 8,750,653 B1* | 6/2014 | Peters | ................... | G01J 5/0837 385/12 |
| 8,786,042 B2* | 7/2014 | Gravrand | ............ | H01L 31/0232 257/436 |
| 8,835,899 B2* | 9/2014 | Yang | ...................... | B82Y 10/00 257/9 |
| 8,897,609 B1* | 11/2014 | Davids | ...................... | G01J 1/42 385/12 |

(Continued)

OTHER PUBLICATIONS

Chen et al., Nature, 444, pp. 597-600 (Nov. 30, 2006) | doi:10.1038/nature05343.*

(Continued)

*Primary Examiner* — Fernando L Toledo
*Assistant Examiner* — Christine L Hagan
(74) *Attorney, Agent, or Firm* — Kevin W. Bieg

(57) ABSTRACT

The integration of bilayer graphene with an absorption enhancing sub-wavelength antenna provides an infrared photodetector capable of real-time spectral tuning without filters at nanosecond timescales.

16 Claims, 4 Drawing Sheets

(56) References Cited

U.S. PATENT DOCUMENTS

| | | | |
|---|---|---|---|
| 2004/0159865 A1* | 8/2004 | Allen et al. .................... 257/280 |
| 2004/0217375 A1* | 11/2004 | Yokogawa et al. ............ 257/192 |
| 2007/0138482 A1* | 6/2007 | Tanimoto ........................ 257/77 |
| 2011/0006837 A1* | 1/2011 | Wang et al. .................... 327/539 |
| 2011/0156189 A1* | 6/2011 | Gravrand ............ H01L 31/1032 257/432 |
| 2012/0068158 A1* | 3/2012 | Komiyama ....... H01L 27/14649 257/24 |
| 2012/0175594 A1* | 7/2012 | Chen ................... H01L 29/4908 257/29 |
| 2012/0205518 A1* | 8/2012 | Voutilainen ............. G01J 3/513 250/200 |
| 2013/0001519 A1* | 1/2013 | Chen ................... H01L 29/4908 257/29 |
| 2013/0228887 A1* | 9/2013 | Wehner ............... H01L 27/1446 257/432 |

OTHER PUBLICATIONS

Waldmann et al., Nature Materials, 10, 357-360 (2011) | doi:10.1038/nmat2988.*
"Antenna." Dictionary.com Unabridged. Random House, Inc. Apr. 29, 2015. <Dictionary.com http://dictionary.reference.com/browse/antenna>.*
Echtermeyer, T. J., et al. "Strong Plasmonic Enhancement of Photovoltage in Graphene." (2011): arXiv. Web. Sep. 20, 2015.*
Lin, Y-M. et al., "Strong Suppression of Electrical Noise in Bilayer Graphene Nanodevices", Nano Letters, 2008, pp. 2119-2125, vol. 8.
Xia, F. et al., "Ultrafast Graphene Photodetector", Nature Nanotechnology, 2009, pp. 839-843, vol. 4.

Zhang, Y. et al., "Direct Observation of a Widely Tunable Bandgap in Bilayer Graphene", Nature, 2009, pp. 820-823, vol. 459.
Lee, S. et al., "Magnetotransport Properties of Quasi-Free-Standing Epitaxial Graphene Bilayer on SiC: Evidence of Bernal Stacking", Nano Letters, 2011, pp. 3624-3628, vol. 11.
Ryzhii, V. et al., "Graphene Bilayer Field-Effect Phototransistor for Terahertz and Infrared Detection", Physical Review B, 2009, pp. 245311-1-245311-8, vol. 79.
Xia, F. et al., "Photocurrent Imaging and Efficient Photon Detection in Graphene Transistor", Nano Letters, 2009, pp. 1039-1044, vol. 9.
Nair, R.R. et al., "Fine Structure Constant Defines Visual Transparency of Graphene", Science, 2008, p. 1308, vol. 320.
Ohta, T. et al., "Role of Carbon Surface Diffusion on the Growth of Epitaxial Graphene on Sic", Physical Review B, 2010, pp. 121411-1-121411-4, vol. 81.
Lee, S. et al., "Wafer Scale Homogeneous Bilayer Graphene Films by Chemical Vapor Deposition", Nano Letters, 2010, pp. 4702-4707, vol. 10.
Waldmann, D. et al., "Bottom-Gated Epitaxial Graphene", Nature Materials, 2011, pp. 357-360, vol. 10.
Echtermeyer, T.J. et al., "Strong Plasmonic Enhancement of Photovoltage in Graphene", Nature Communications, 2011, pp. 1-5, vol. 2.
Peters, D. W. et al., "Metamaterial-Inspired High-Absorption Surfaces for Thermal Infrared Applications", Proceedings of SPIE, 2010, pp. 76091C-1-767091C-7, vol. 7609.
Peters, D. W. et al., "Infrared Frequency Selective Surfaces for Sensor Applications", Proceeding of SPIR, 2009, pp. 72983L-1-72983L-8, vol. 7298.

* cited by examiner

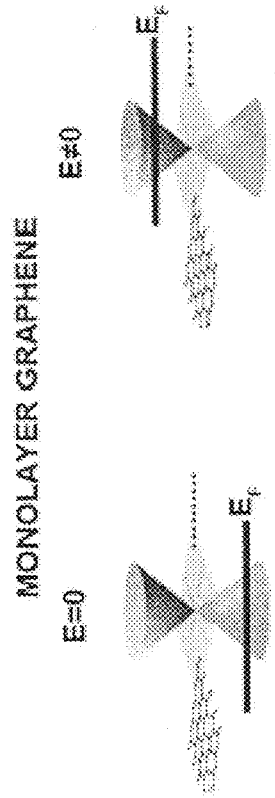
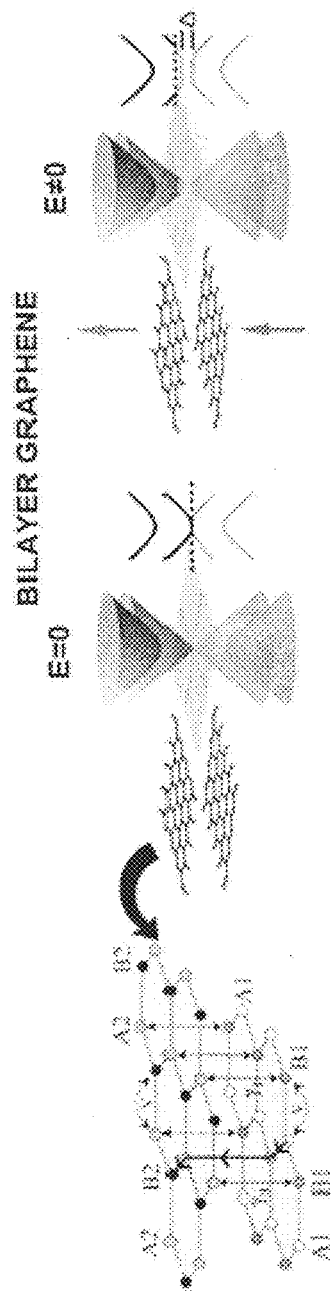
FIG. 1a
FIG. 1b

SUB-WAVELENGTH ANTENNA ENHANCED BILAYER GRAPHENE TUNABLE PHOTODETECTOR

CROSS-REFERENCE TO RELATED APPLICATION

This application claims the benefit of U.S. Provisional Application No. 61/732,667, filed Dec. 3, 2012, which is incorporated herein by reference.

STATEMENT OF GOVERNMENT INTEREST

This invention was made with Government support under contract no. DE-AC04-94AL85000 awarded by the U. S. Department of Energy to Sandia Corporation. The Government has certain rights in the invention.

FIELD OF THE INVENTION

The present invention relates to photodetectors and, in particular, to the integration of bilayer graphene with an absorption enhancing sub-wavelength antenna to provide an infrared photodetector capable of real-time spectral tuning without filters at nanosecond timescales.

BACKGROUND OF THE INVENTION

Bilayer graphene (BLG) offers advantages that its more common form, monolayer graphene, does not. Most prominently, a dynamic, tunable bandgap can be readily induced in BLG from the near infrared to THz using only electrical fields. See Y. Lin and P. Avouris, *Nano Letters* 8, 2119 (2008); F. Xia et al., *Nature Nanotechnoloqy* 4, 839 (2009); and Y. Zhang et al., *Nature* 459, 820 (2009), which are incorporated herein by reference. This ability to tune the bandgap with only solid state technology enables faster, filter-less and more sensitive multispectral and hypertemporal imaging applications. Practically realizing these advantages, however, requires the ability to fabricate a tunable BLG device and a means to increase the absorption within this atomically thin material, which absorbs less than 5% of the incident light.

Therefore, a need remains for a BLG-based infrared photodetector that combines the tunability of BLG with a means to enhance the absorption of the BLG.

SUMMARY OF THE INVENTION

The present invention is directed to a tunable photodetector, comprising a bilayer graphene layer; a gate dielectric layer disposed on the frontside of the bilayer graphene layer; a resonant sub-wavelength antenna top gate disposed on the gate dielectric layer for enhancing absorption of incident light in the bilayer graphene layer; a conductive back gate disposed on the backside and insulated from the bilayer graphene layer for applying an electric field with the top gate across the bilayer graphene layer to tune a bandgap therein; and a source and a drain disposed on the bilayer graphene layer with the gate dielectric layer therebetween, thereby forming a dual-gated field-effect transistor. The bandgap can be tunable from mid-wavelength infrared (approximately 5 microns wavelength) to the terahertz regime.

The bilayer graphene layer can comprise epitaxial graphene grown on a semi-insulating silicon carbide substrate. The conductive back gate can comprise a region of conductive ions implanted in the semi-insulating silicon carbide substrate. Alternatively, the conductive back gate can comprise a highly doped silicon carbide substrate and the semi-insulating substrate can comprise an undoped silicon carbide layer grown on the highly doped silicon carbide substrate. Alternatively, the semi-insulating silicon carbide substrate can be back-thinned and a metal layer can be deposited on the backside of the back-thinned silicon carbide substrate to provide the conductive back gate and a back metal reflector. The thin gate dielectric layer can comprise $SiO_2$, $Al_2O_3$, $Si_3N_4$, $HfO_2$, or any other suitable dielectric material.

The present invention can be used as a real-time tunable BLG-based infrared photodetector. The photodetector integrates a BLG field-effect transistor (FET) with a surface mode coupling sub-wavelength antenna, which resonantly couples with the incident light in such a way to greatly enhance absorption in the BLG. As described below, the photodetector can comprise a dual-gated BLG FET in which the top gate serves both as the metal contact modulating the electric field to tune the bandgap and as an antenna efficiently coupling the electromagnetic field to the BLG. The device capitalizes on the unique properties of graphene to enable an infrared (IR) photodetector having multispectral and hypertemporal capability. Photodetectors based on BLG enable persistent surveillance through the material's differentiating ability to offer real-time, electronically actuated, spectral tuning from the mid-wavelength IR (MWIR) through the THz with nanosecond switching speeds. In particular, BLG-enabled sensors enable continuous collection for a diverse set of targets having spatial, spectral, and temporal variations. Since BLG-based detectors offer spectral selectivity without the need of a filter stack they have advantages over conventional compound semiconductor sensors in push broom and staring remote sensing applications.

BRIEF DESCRIPTION OF THE DRAWINGS

The detailed description will refer to the following drawings, wherein like elements are referred to by like numbers.

FIG. 1a is a schematic illustration of the electronic band structure of monolayer graphene. FIG. 1b shows the electronic band structure of bilayer graphene.

FIG. 2a is a side-view schematic illustration of an embodiment wherein a semi-insulating SiC wafer that is ion implanted beneath the contact and electrically contacted using the reflective backplane for the antenna. FIG. 2b is a side-view schematic illustration of an embodiment wherein the back-gate is formed by utilizing an epitaxially grown doped SiC substrate that rests on semi-insulating epitaxial layer of SiC. FIG. 2c is a side-view schematic illustration of an embodiment wherein a semi-insulating SiC substrate is etched back allowing for metal deposition near the bilayer graphene to provide a back electrical contact and reflective backplane.

DETAILED DESCRIPTION OF THE INVENTION

Figure 2A:
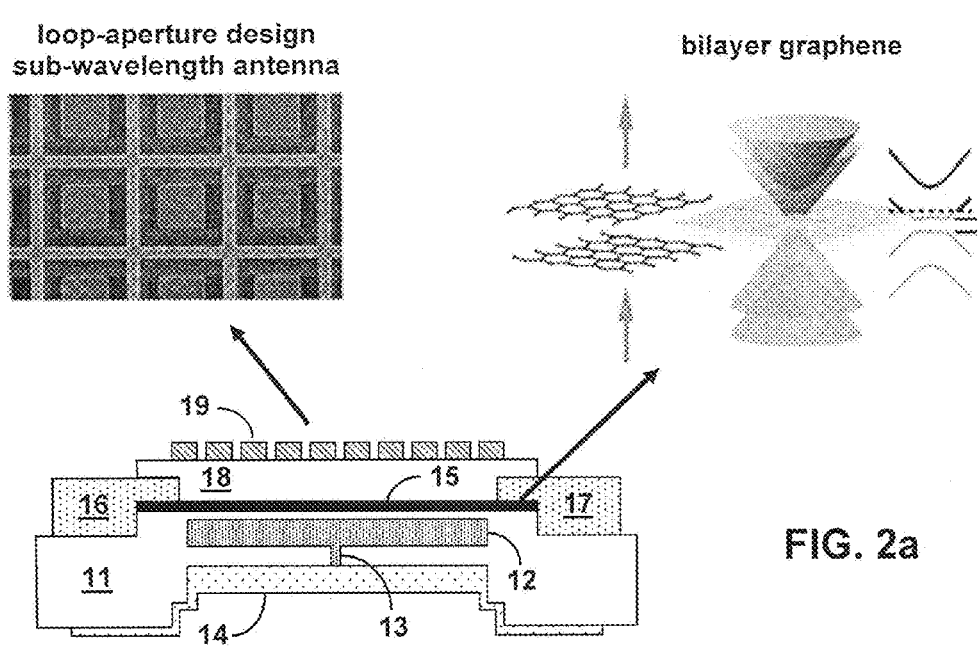
FIGS. 2a-c show examples of tunable photodetectors that integrate bilayer graphene with a top-side sub-wavelength antenna that functions both as a means to increase absorption and as a top-side gate to a field-effect transistor.

Typical infrared sensor materials are composed of complex semiconductors, such as HgCdTe (MCT) and InGaAs, that are utilized both as a consequence of their bandgap being commensurate with IR wavelengths and their ability to tune this gap over a spectral range based upon the material's composition. Such tunability is realized, however, only during design as the composition of the detectors and, therefore, the bandgap is fixed upon their fabrication. Dynamic, real-time, tunability in contrast, would enable multi-color operation as well as the flexibility to optimize based upon differing operational imperatives. Recent work has shown that graphene-based devices can have a continuously tunable bandgap thereby opening the possibility to realize a fully adaptable multi-color IR detector. See Y. Zhang et al., *Nature* 459, 820 (2009), which is incorporated herein by reference. In addition, due to its high electron mobility (4400 $cm^2V^{-1}$ $s^{-1}$), graphene-based photodetectors are also capable of operating at ultrafast timescales with an intrinsic bandwidth that may exceed 500 GHZ. See K. Lee et al., *Nano Letters* 11, 3624 (2011); and F. Xia, et. al., *Nature Nanotechnology* 4, 839 (2009), which are incorporated herein by reference. Furthermore, because graphene devices exhibit very low noise characteristics, graphene-based photodetectors can operate with reduced cooling requirements. See Y. Lin and P. Avouris, *Nano Letters* 8, 2119 (2008); and V. Ryzhii and M. Ryzhii, *Physical Review B* 79, 245311 (2009).

However, monolayer graphene (MLG) is a semi-metal for which at typical pixel sizes it is impossible to create a bandgap. Thus, while previous work has demonstrated MLG's promise as an ultrafast and efficient photodetector, the material's nearly constant broadband response effectively removes any possibility for its use as a filter-less multispectral detector. See F. Xia, et. al., *Nature Nanotechnology* 4, 839 (2009); F. Xia et al., *Nano Letters* 9, 1039 (2009); and R. R. Nair et al., *Science* 320, 1308 (2008). MLG's lack of bandgap arises due to its unique electronic structure characterized by two cones that intersect at the Dirac point, which is typically near the Fermi energy ($E_F$), as shown in FIG. 1a. Upon application of a transverse electric field (i.e., E≠0), only the Fermi energy changes and no bandgap forms. Bilayer graphene, on the other hand, has four distinct bands that arise due to the sublattice that is created by the inequivalent sites (A1 vs. A2 and B1 vs. B2 in FIG. 1b) between two hexagons stacked in a Bernal arrangement. Upon the application of an electric field (i.e., E≠0) perpendicular to the layers, the symmetry between these inequivalent sites is removed thereby inducing a bandgap Δ in the electronic structure. Previous work has shown through FTIR spectroscopy that this band can be tuned using only electronic fields. See Y. Zhang et al., *Nature* 459, 820 (2009).

BLG-Based Tunable IR Photodetector

The present invention is directed to a tunable photodetection enabled by bilayer graphene that has viable quantum efficiencies through the utilization of an absorption augmenting sub-wavelength antenna. The tunable BLG-based detector comprises a dual-gated field effect transistor (FET) structure with enhanced absorption. Incorporation of metallic top and bottom gate structures (i.e., the dual gates) provides for the application of both the transverse electric field that induces a bandgap in the BLG layer, as well as control of the Fermi energy's position within the created gap. To enhance the absorption, the top gate can comprise a resonant sub-wavelength antenna array that can be coupled with a reflecting backplane that can either serve as the bottom gate itself or be located directly behind the bottom gate. The locations of the gates and reflector are important for optimizing the strength of the electric field across the BLG (maximizing bandgap magnitude) and for optimizing the absorption. Described below are exemplary embodiments and methods of fabricating tunable BLG FETs having integrated antennas. The primary difference in the three embodiments is the method used to form a back gate contact and back reflector.

FIG. 2a is a schematic illustration of an embodiment wherein a semi-insulating silicon carbide wafer that is ion implanted beneath the contact and electrically contacted using the reflective backplane for the antenna. A semi-insulating silicon carbide (SiC) substrate 11 can be implanted with conductive ions to form a conductive back gate 12 and via 13 for later connection to a backside metal contact 14. This implantation approach is similar to that performed by Waldman et al. who used N ions to form the back gate of an epitaxial based graphene FET. See D. Waldmann et al., *Nat Mater* 10, 357 (2011), which is incorporated herein by reference. To ease the required implantation conditions and maximize the effectiveness of the back metal reflector 14, the SiC 11 can be first thinned to a distance of ~¼ λ from the BLG layer 15 using $SF_6/O_2$ to form a graphene/SiC mesa. Ion implantation can then be performed underneath the mesa in order to locate the back gate 12 about 100 nm away from the graphene 15. After implantation, the back side can be coated with metal 14 to form both the reflector and to provide electrical contact to the bottom gate via 13. On the top side, source and drain metals 16 and 17 can be deposited using standard optical lithography and lift-off, followed by the deposition of a thin (e.g., ~50 nm) gate dielectric layer 18. The dielectric material preferably is transparent to the wavelength of the incident radiation and has a large DC dielectric constant to facilitate the opening of the bandgap. For example, the dielectric material can be $SiO_2$, $Al_2O_3$, $Si_3N_4$, or $HfO_2$, although other suitable dielectric materials can also be used. Upon this dielectric layer 18, the antenna array 19 can be patterned in photoresist and deposited with a metal liftoff process. The antenna 19 can comprise a connected geometry, such as the periodic loop-aperture design shown in the inset to FIG. 2a, to enable it to be also used as a top gate electrode.

Figure 2B:
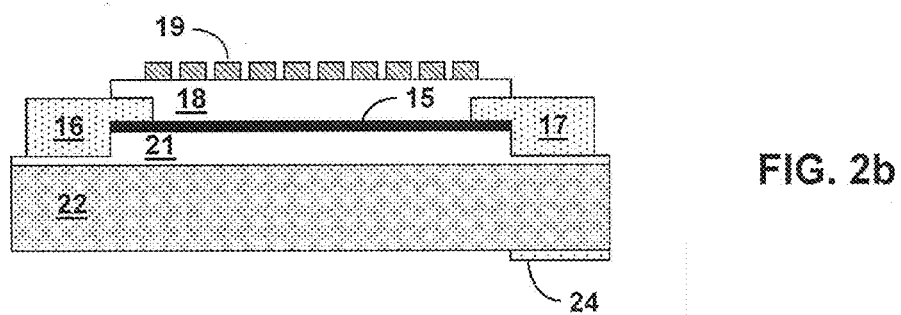
Figure 2C:
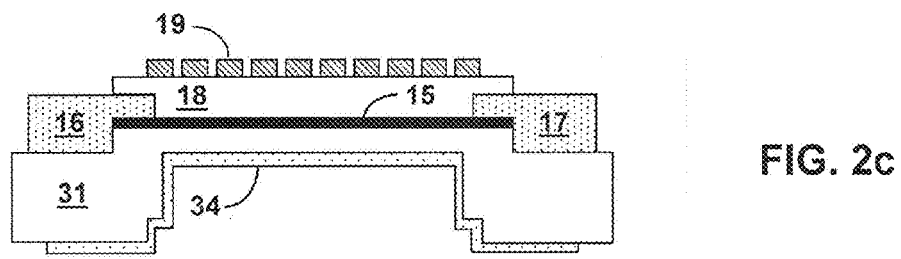

The structures shown in FIG. 2b and FIG. 2c are similar in many of the process steps to those described above. In FIG. 2b, for example, the implant step is not required as the initial SiC substrate 22 can be already highly doped and therefore electrically conductive. On this substrate, an undoped SiC layer 21 can be epitaxially grown and then used as the native layer for growth of the bilayer graphene 15. Back thinning of the highly-doped SiC substrate 22, formation of the back contact 24, and fabrication of the top of the device then proceeds as described above. In FIG. 2c, a semi-insulating SiC substrate 31 can itself be back-thinned to such a degree as to allow for the direct deposition of a backside metal layer 34. In this embodiment, the backside metal layer 34 serves as both the back metal reflector and the back-gate contact.

This invention can use any suitable method for producing large area Bernal stacked bilayer graphene films. Epitaxial methods in which graphene is formed atop a SiC substrate, as described above, have been demonstrated to form large areas of high quality BLG necessary for the greatest tunability. See T. Ohta et. al., *Phys Rev B* 81, 121411 (2010); and K. Lee et al., *Nano Letters* 11, 3624 (2011), which are incorporated herein by reference. Alternatively, chemical vapor deposition (CVD) techniques are also capable of producing bilayer films but have so far lacked large single crystal domains, which in turn lessens the ability to open up sizable and uniform bandgaps. See S. Lee et al., *Nano Letters* 10, 4702 (2010). Alternatively, structures similar to those described above can be realized by transferring a Bernal stacked bilayer graphene film from a substrate atop of which growth took place to a host substrate. For example, bilayer graphene growth can take place using any number of means known to those skilled in the art on top of virtually any growth substrate. The BLG films can then be transferred using known transfer technologies and grafted to any host substrate including but not limited to standard silicon wafers. Subsequently, dual gated structures analogous to those described above can be fabricated using the BLG-grafted host substrate.

Because BLG is only 2 atoms thick, absorption in the active bilayer material is extremely small (~5%). See R. R. Nair et al., *Science* 320, 1308 (2008). Therefore, the present invention uses resonant sub-wavelength metallic antennas to amplify the absorption via resonant surface mode coupling. The sub-wavelength antenna can elevate the quantum efficiency (QE) of the device by increasing the electric field strength in the plane of the BLG. This is the result of the antenna coupling incident plane waves of light to surface modes that themselves have extremely concentrated electric fields. These concentrated electric fields, in turn, create an amplified number of evanescent photons that serve to increase the total absorption within the sensor. See T. J. Echtermeyer et al., *Nat Commun* 2, 458 (2011), which is incorporated herein by reference. The fields are stronger than those that can reasonably be achieved with a Fabry-Perot type of structure with a similar bandwidth. Moreover, the sub-wavelength antenna structure is angularly independent, unlike a Fabry-Perot device. These antennas also have an advantage over simple plasmonic coupling structures, such as arrays of holes in a metal surface, by having the ability to change the bandwidth and center wavelength through geometrical changes to the antenna unit cell.

The antenna can comprises a conductive layer patterned with a periodic array of sub-wavelength apertures. The design of the aperture allows spectral and angular control of the absorption band. For example, the antenna can comprise a loop-aperture design, although other unpolarized and polarized aperture designs can also be used. Near perfect absorption near 10 μm for any angle of incidence in a frequency specific surface (FSS) sub-wavelength antenna above a ground plane has been demonstrated. See D. Peters, *Proc. SPIE* 7609, 76091C (2010) and D. Peters, *Proc. SPIE* 7298, 7298L-1C (2009), which are incorporated herein by reference. The resonant absorption of the FSS is due to coupling of the incident radiation to surface electromagnetic modes bound to the metal surface. These bound modes are tightly confined to the surface and have much stronger electric field strengths than does the incident radiation, enabling only a thin layer of underlying absorbing material to be used. In the present invention, the thin BLG can be placed in this high-field region of an antenna to enhance the quantum efficiency of the photodetector. The patterned antenna can be made from a metal or other highly conductive material, such as a highly doped semiconductor. With metals, such as aluminum or gold, the thickness of the antenna can be about 100 nm. The periodicity of the antenna is sub-wavelength and, preferably, between ⅓ and 1/10 the wavelength λ, of the incident light. BLG has a bandgap that is tunable from the mid-wavelength infrared (about 5 μm wavelength) into the THz regime. Nanoantennas can be fabricated for this portion of the electromagnetic spectrum using standard lithographic techniques.

BLG can support novel surface modes due to its exceptionally high optical conductivity. See A. Vakil and N. Engheta, *Science* 332, 1291 (2011). Additionally, a similar approach has been recently reported to increase the absorption within monolayer graphene by a factor of 20. See T. J. Echtermeyer et al., *Nat Commun* 2, 458 (2011). Combining BLG in a resonant FSS antenna structure can enhance the infrared absorption to a degree proportional to the increase in the electric field enhancement. This resonant enhancement of the absorption, in turn, can result in a 20× increase in the total quantum efficiency of the detector. Accordingly, the external quantum efficiency of a BLG-based photodetector can be ~50%.

Applications of the BLG-Based IR Photodetector

As described above, the present invention integrates bilayer graphene with absorption enhancing resonant sub-wavelength antennas in order to provide a photodetector capable of real-time spectral tuning without filters at nanosecond timescales. Bilayer graphene offers unique advantages not available with other materials utilized for IR sensors. Beyond having inherently low noise characteristics and the potential to operate at temperatures above 100K, BLG-based sensors have a bandgap that can be tuned electronically "on the fly" with nanosecond switching speeds thereby opening up completely new possibilities for persistent surveillance.

Figure 3:
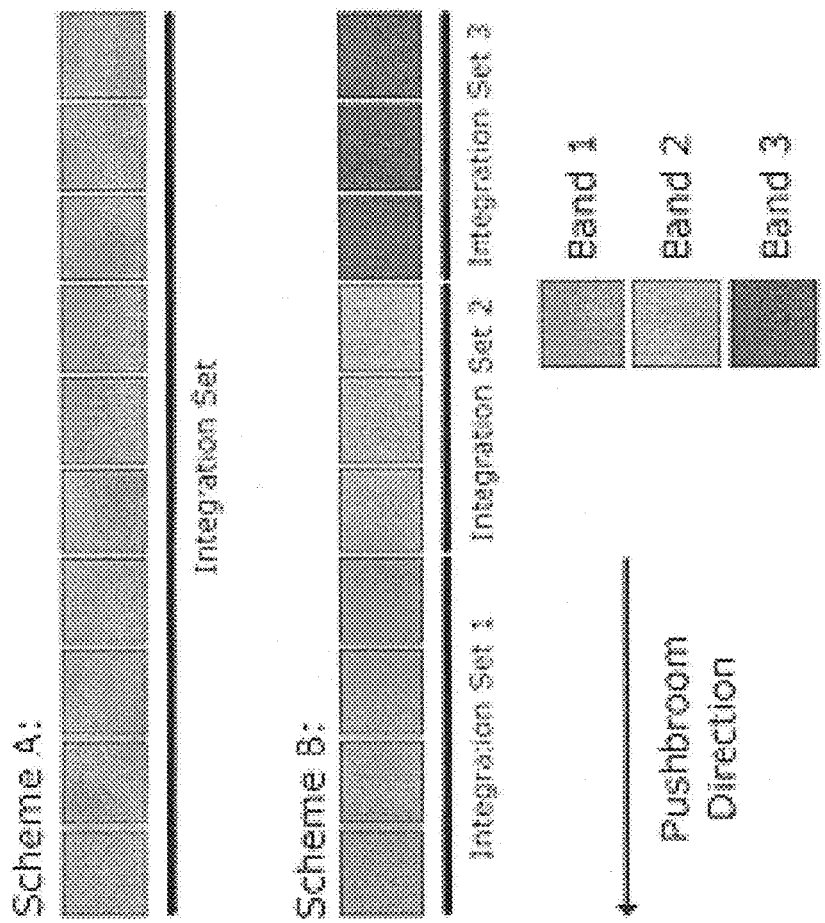
FIG. 3 is a schematic illustration of two schemes in which a BLG photodetector can operate without filter wheels.

A push broom scanner is a technology for obtaining satellite images with the optical cameras. It can be used for passive remote sensing from space. In a push broom sensor, a line of sensors arranged perpendicular to the flight direction of the spacecraft is used. Different areas of the surface are imaged as the spacecraft flies forward. Using conventional MCT sensors, filters must be placed in the optical path to select certain spectral bands as the underlying material has a broadband response spanning the MWIR to LWIR. In contrast, the BLG-based photodetector of the present invention enables the elimination of these filters as the BLG material can be electronically tuned to the desired wavelengths. Consider, for example, a time-delay integration (TDI) push broom sensor. In practice, such TDI systems are oftentimes employed when there is low light from the scene. Therefore, as shown in scheme A of FIG. 3, all BLG pixels in an Integration Set can be tuned on the fly to the same frequency and integrated to increase sensitivity for a specific band, just as is typical for TDI MCT systems. However, because of BLG's real time tuning, sufficient lighting can allow for parts of the TDI system to be tuned to different spectral regions. Therefore, in scheme B, the pixels for three different integration sets (i.e., Integration Set 1, Integration Set 2, and Integration Set 3) can be tuned to different frequencies (i.e., Band 1, Band 2, and Band 3) and integrated by frequency group. Thus, a single band TDI system can be electronically tuned to generate a multispectral response under sufficient lighting conditions. Consequently, the BLG-based photodetector enables a variety of spectral and multispectral capabilities that can be dynamically adapted for best observing the targets being observed.

Figure 4:
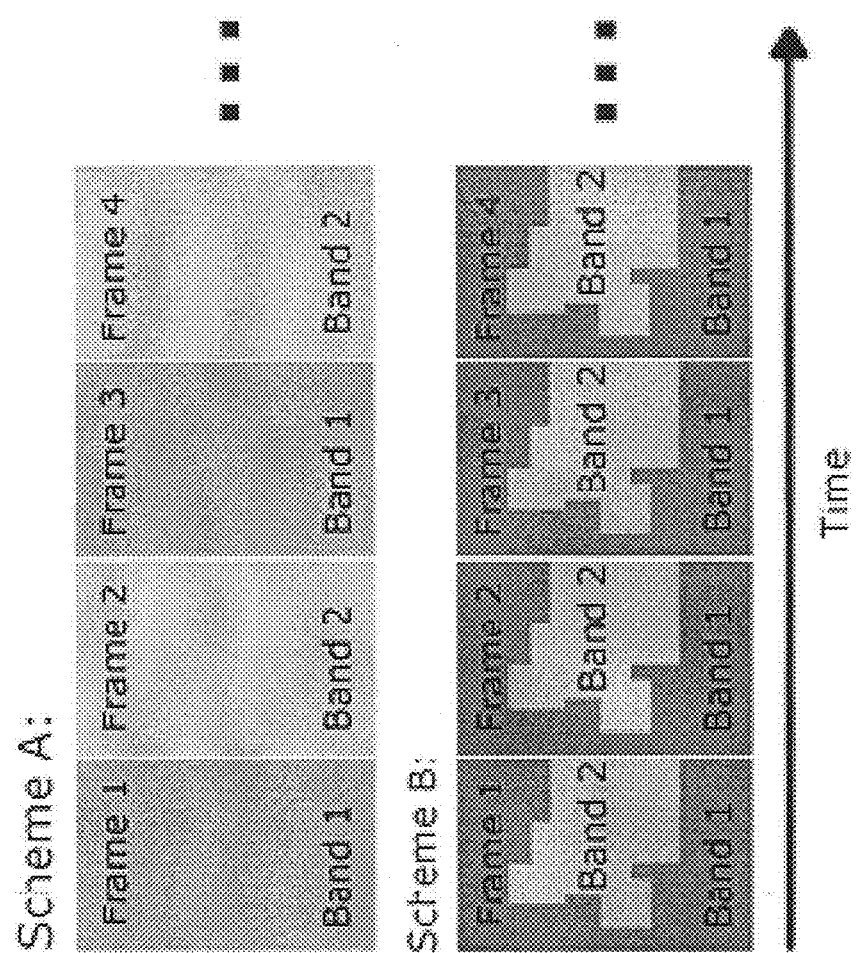
FIG. 4 is a schematic illustration of two schemes for hyper-temporal imaging using the filter-less tuning capability of a BLG photodetector.

Staring focal plane arrays (FPAs) employed in hypertemporal imaging can also be dramatically improved with the use of BLG-based photodetectors. Often MCT-based hypertemporal systems operate in a fixed single band or set of bands due to the inherent difficulty of managing optical filters. The BLG-based detector of the present invention, in contrast, enables filter-less tuning on nanosecond timescales, which are much less than typical integration times. Therefore, each pixel can change its spectral response independent of neighboring pixels and on timescales on par with the phenomenon being observed. This capability enables new possibilities for remote sensing. Consider, for instance, two different hypertemporal schemes that are enabled by BLG-based detectors as is illustrated in FIG. 4. In scheme A, every frame obtained can be of a different spectral range. By integrating successive frames (i.e., Frame 1 through Frame 2) within differing spectral bands (i.e., Band 1 and Band 2), scheme A provides dual multispectral-hypertemporal imaging without complicated filter wheels. Alternatively, in scheme B, an image's spectral response can be tailored to regions of interest dependent on the target signatures present. Specifically, scheme B utilizes differing bands (i.e., Band 1 and Band 2) throughout the imaging array (i.e., Frame 1 through Frame 4) based upon the target, thus enabling spatial-multispectral hypertemporal imaging. Furthermore, by utilizing BLG's "pixel-by-pixel" tuning, any combination of scheme A and B can be used thereby creating spatial-multispectral hypertemporal imagery that can enable a sensor to simultaneously collect a diverse, highly dynamic set of targets.

The present invention has been described as a resonant sub-wavelength antenna enhanced bilayer graphene tunable photodetector. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A tunable photodetector, comprising:
a bilayer graphene layer;
a gate dielectric layer disposed on the frontside of the bilayer graphene layer;
a resonant sub-wavelength antenna top gate disposed on the gate dielectric layer, wherein the resonant sub-wavelength antenna top gate and the gate dielectric layer are adapted to amplify the absorption of incident light in the bilayer graphene layer by resonant surface mode coupling;
a conductive back gate disposed on the backside and insulated from the bilayer graphene layer for applying an electric field with the top gate across the bilayer graphene layer to tune a bandgap therein; and
a source and a drain disposed on the bilayer graphene layer with the gate dielectric layer therebetween, thereby forming a dual-gated field-effect transistor.

2. The tunable photodetector of claim 1, wherein the bandgap is tunable from the mid-infrared to terahertz regime of the incident light.

3. The tunable photodetector of claim 1, wherein the incident light has a wavelength greater than 5 microns.

4. The tunable photodetector of claim 1, wherein the bilayer graphene layer comprises epitaxial graphene grown on a semi-insulating silicon carbide substrate.

5. The tunable photodetector of claim 4, wherein the conductive back gate comprises a region of conductive ions implanted in the semi-insulating silicon carbide substrate.

6. The tunable photodetector of claim 5, further comprising a back metal reflector on the back side of the ion-implanted semi-insulating silicon carbide substrate.

7. The tunable photodetector of claim 4, wherein the conductive back gate comprises a highly doped silicon carbide substrate and wherein the semi-insulating substrate comprises an undoped silicon carbide layer grown on the highly doped silicon carbide substrate.

8. The tunable photodetector of claim 4, wherein the semi-insulating silicon carbide substrate is back-thinned and a metal layer is deposited on the backside of the back-thinned silicon carbide substrate to provide the conductive back gate and a back metal reflector.

9. The tunable photodetector of claim 1, wherein the sub-wavelength antenna comprises a conductive layer patterned with a periodic array of sub-wavelength apertures.

10. The tunable photodetector of claim 9, wherein the sub-wavelength antenna comprises a frequency specific surface structure.

11. The tunable photodetector of claim 9, wherein the periodic array of sub-wavelength apertures has a periodicity of less than one-third the wavelength of the incident light.

12. The tunable photodetector of claim 9, wherein the periodic array of sub-wavelength apertures comprises a connected periodic loop-aperture geometry.

13. The tunable photodetector of claim 1, wherein the gate dielectric layer comprises $SiO_2$, $Al_2O_3$, $Si_3N_4$, or $HfO_2$.

14. The tunable photodetector of claim 1, wherein the thickness of the gate dielectric layer is less than 100 nanometers.

15. The tunable photodetector of claim 1, wherein the conductive back gate provides a reflecting backplane that is coupled with the sub-wavelength antenna to further enhance absorption of the incident light in the bilayer graphene layer.

16. The tunable photodetector of claim 1, further comprising a reflecting backplane disposed on the backside of the conductive back gate that is coupled with the sub-wavelength antenna to further enhance absorption of the incident light in the bilayer graphene layer.

* * * * *